United States Patent
Arimoto et al.

(10) Patent No.: US 6,898,137 B2
(45) Date of Patent: May 24, 2005

(54) SEMICONDUCTOR MEMORY DEVICE WITH HIGH-SPEED SENSE AMPLIFIER

(75) Inventors: Kazutami Arimoto, Hyogo (JP); Hiroki Shimano, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 52 days.

(21) Appl. No.: 10/403,009

(22) Filed: Apr. 1, 2003

(65) Prior Publication Data

US 2004/0085844 A1 May 6, 2004

(30) Foreign Application Priority Data

Oct. 30, 2002 (JP) ......................................... 2002-316026

(51) Int. Cl.[7] ................................................. G11C 7/02
(52) U.S. Cl. ................ 365/210; 365/185.13; 365/185.2
(58) Field of Search ......................... 365/185.13, 185.22, 365/185.2, 185.12, 149, 189.01, 210, 190, 203, 204

(56) References Cited

U.S. PATENT DOCUMENTS

| | | | | |
|---|---|---|---|---|
| 5,003,542 A | * | 3/1991 | Mashiko et al. | 714/772 |
| 5,105,385 A | * | 4/1992 | Ohtsuka et al. | 365/185.2 |
| 5,822,248 A | * | 10/1998 | Satori et al. | 365/185.21 |
| 5,825,702 A | * | 10/1998 | Noda | 365/203 |
| 6,418,044 B1 | * | 7/2002 | Laurent | 365/149 |
| 6,504,752 B2 | * | 1/2003 | Ito | 365/158 |
| 6,741,505 B2 | * | 5/2004 | Yokozeki | 365/189.07 |

FOREIGN PATENT DOCUMENTS

JP    63-282994    11/1988

OTHER PUBLICATIONS

Saito, S. et al.; A 1Mb CMOS DRAM with Fast Page and Static Column Modes:, *IEEE International Solid–State Circuits Conf. Digest of Tech. Papers*, pp. 252–253, (Feb. 15,1985).

* cited by examiner

Primary Examiner—Richard Elms
Assistant Examiner—Dang T Nguyen
(74) Attorney, Agent, or Firm—Leydig, Voit & Mayer, Ltd.

(57) ABSTRACT

In a Vss precharge scheme, dummy cells including a bit line contact, a storage node contact and a third contact connected to a Vccs power supply line are arranged in complementary bit lines. In a waiting state, H level data is written in each dummy cell from the Vccs power supply line. Before row activation is started and a normal word line is selected, a dummy word line is driven to a selected state, and the H level data is read from each dummy cell. Therefore, charge in equal amounts is injected to the complementary bit lines, and a shift from a Vss level to the same potential occurs. A sense amplifier uses the potential as a reference voltage to amplify and detect a potential difference between bit lines.

14 Claims, 12 Drawing Sheets

SEMICONDUCTOR MEMORY DEVICE WITH HIGH-SPEED SENSE AMPLIFIER

BACKGROUND OF THE INVENTION

1. Field of the Invention

The present invention relates to a semiconductor memory device, and more particularly to a semiconductor memory device mounted on a system LSI driven with a low power supply voltage.

2. Description of the Background Art

In order to process data with high speed and low power consumption, in a field of data processing, a circuit device referred to as a system LSI (large-scale integrated circuit) has been in widespread use, in which a logic such as an analogue processing circuit, for example, an A/D conversion circuit, and a memory device such as a DRAM (dynamic random access memory) are integrated on the same semiconductor chip.

In the system LSI, recently, lower voltage has been demanded, and accordingly, lower power supply voltage has been required also in the aforementioned embedded DRAM.

On the other hand, in the embedded DRAM, the use of a lower power supply voltage is not achieved simultaneously with a required high-speed performance due to a sensing operation of a sense amplifier.

The sense amplifier refers to a differential amplifier connected to a bit line pair having memory cells connected. The sense amplifier uses a reference voltage to amplify a weak signal that appears on one of the bit line pair from a selected memory cell by a differential voltage between the line pair, thus performing polarity discrimination.

Here, a method of generating the reference voltage is different, depending on a scheme of precharging a bit line. That is, the scheme of precharging the bit line includes a Vcc precharge scheme and a ½ Vcc precharge scheme.

In the Vcc precharge scheme, a precharge voltage of the bit line is set to power supply voltage Vcc which is a maximum voltage that a data line can have. In such a scheme, a reference voltage generating circuit is necessary to generate an intermediate value between two signal voltages. The reason is as follows. When a memory cell storing Vcc voltage is read, there is no potential difference between a storage node of the cell and the bit line. Therefore, there is no voltage change in the bit line, and thus no voltage difference appears between the line pair.

On the other hand, in the ½ Vcc precharge scheme, a precharge voltage of the bit line is set to an intermediate value between power supply voltage Vcc, which is a maximum of the bit line, and a ground potential Vss, which is a minimum of the same. Here, since a signal voltage corresponding to binary information appears relative to ½ Vcc, the reference voltage generating circuit is not needed, and the reference voltage is equal to ½ Vcc.

The Vcc precharge scheme has mainly been used in the sense amplifier in a conventional DRAM, however, a shift toward the ½ Vcc precharge scheme has been seen. This is because the ½ Vcc precharge scheme has satisfactory noise resistance, low power characteristics, a wide voltage margin, and the like.

In the ½ Vcc precharge scheme, however, a problem has been found in a high-speed operation, as the lower power supply voltage is demanded.

In the ½ Vcc precharge scheme, for a transistor within the sense amplifier, an operation point at the beginning of sensing attains a relation of Vgs=½Vcc+|slight potential difference that appeared at the bit line pair| when Vsb=½ Vcc. Therefore, when Vcc is lowered, Vgs approaches a threshold voltage of the transistor. Accordingly, the transistor cannot sufficiently be turned on, and enters what is called a "dead band of sensing" in the sense amplifier. Thus, the sense amplifier cannot perform sensing operation with high speed, and it is difficult to shorten a cycle time.

In the current embedded DRAM in which a lower voltage is required, priority is given to the high-speed operation of the sense amplifier, and the Vcc precharge scheme has been adopted again.

The reason is as follows. In the Vcc precharge scheme, for the transistor in the sense amplifier, the operation at the beginning of sensing is eased so as to attain a relation of Vgs=Vcc+|slight potential difference that appeared at the bit line pair|. Therefore, if Vcc is lowered, the transistor does not enter the dead band of sensing described above, and the high-speed sensing operation can be performed.

Because of the same reason, a Vss precharge scheme in which the precharge voltage of the bit line pair is set to ground voltage Vss (=SGND) is also adopted.

Here, the Vcc precharge scheme and the Vss precharge scheme require the reference voltage generating circuit, because the precharge voltage of the bit line pair cannot be employed as the reference voltage, as described above.

Conventionally, in the Vcc and Vss precharge schemes, one method has been adopted, in which a dummy cell including a capacitor having a structure similar to a memory cell and having a capacitance half a capacitor in the capacitance of the memory cell is arranged in a memory array, and a read voltage which is an intermediate value of the binary information of the memory cell, and is output to the bit line pair when the dummy cell is selected simultaneously with the memory cell, is used as the reference voltage.

As a method of generating the reference voltage, another method has been adopted, in which a dummy word line is newly disposed in the memory array, the dummy word line is connected to complementary bit lines constituting the bit line pair via a capacitor, and the dummy word line is driven to a selected state when the memory cell is selected based on an external address, to generate the reference voltage at the intermediate value of the binary information of the memory cell, accurately at a potential of the complementary bit lines by capacitive coupling. This is proposed, for example, in Japanese Patent Laying-Open No. 63-282994, and in a reference, "A 1 Mb CMOS DRAM with Fast Page and Static Column Modes," Shozo Saito, et al., IEEE International Solid State Circuits Conference Digest of Technical Papers, pp.252–253, Feb. 15, 1985.

In the former method of arranging the dummy cell within the memory array, however, it is difficult, in the viewpoint of process, to form the dummy cell having a capacitance half the cell capacitance in a portion of the memory cell array, as the memory cell has adopted a three-dimensionally structured capacitor such as a stacked capacitor and a trench capacitor, to achieve smaller size. That is, it is difficult to generate the reference voltage with sufficient accuracy.

In addition, the latter method of generating the reference voltage in the bit line by capacitive coupling of the capacitor connected between the dummy word line and the bit line has following defects. That is, the potential that appears at the bit line is small because the capacitance of the capacitor is small, and a sufficient sense margin cannot be secured. Moreover, in the highly integrated memory array, the capacitance of the capacitor connected in parallel with the dummy word line is increased, and a time difference is caused in generating a potential that appears at each bit line when the dummy word line is activated. Further, characteristics are varied among capacitors due to a manufacturing process.

As described above, in the conventional ½ Vcc precharge scheme and the Vcc (or Vss) precharge scheme, a high-speed and normal sensing operation in the sense amplifier cannot be performed under the low power supply voltage. That is, in such schemes, it is difficult to adopt further lower voltage.

SUMMARY OF THE INVENTION

An object of the present invention is to provide a semiconductor memory device in which a sufficient operation margin can be secured, and a high-speed and stable sensing operation can be achieved, even if the power supply voltage is lowered.

A semiconductor memory device according to the present invention includes: a plurality of normal memory cells arranged in matrix; a plurality of first bit lines arranged corresponding to a column of the normal memory cell, and each having the normal memory cell in a corresponding column connected; a plurality of second bit lines which are arranged corresponding to a column of the normal memory cell, and are complementary to respective one of the plurality of first bit lines; a plurality of normal word lines arranged corresponding to a row of each normal memory cell, and each having the normal memory cell in a corresponding row connected; a reference voltage generating circuit providing and receiving charges of the same amount respectively to/from the plurality of first bit lines and the plurality of second bit lines to generate a reference voltage, before any one normal word line is selected out of the plurality of normal word lines; and a sense amplifier differentially amplifying a potential difference between the first bit line and the second bit line based on the reference voltage.

As described above, according to the present invention, in the semiconductor memory device using the Vcc or Vss precharge scheme, the same amount of charges is provided and received to/from the complementary bit lines constituting the bit line pair, at the same timing as, or just before, data read to the bit line. Then, the sensing operation is performed after the reference potential is shifted to the same level from the Vcc or Vss level which is the precharge voltage. Thus, the operation margin of the sense amplifier can be secured, and the high-speed and stable sensing operation can be attained, even if the power supply voltage is lowered.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
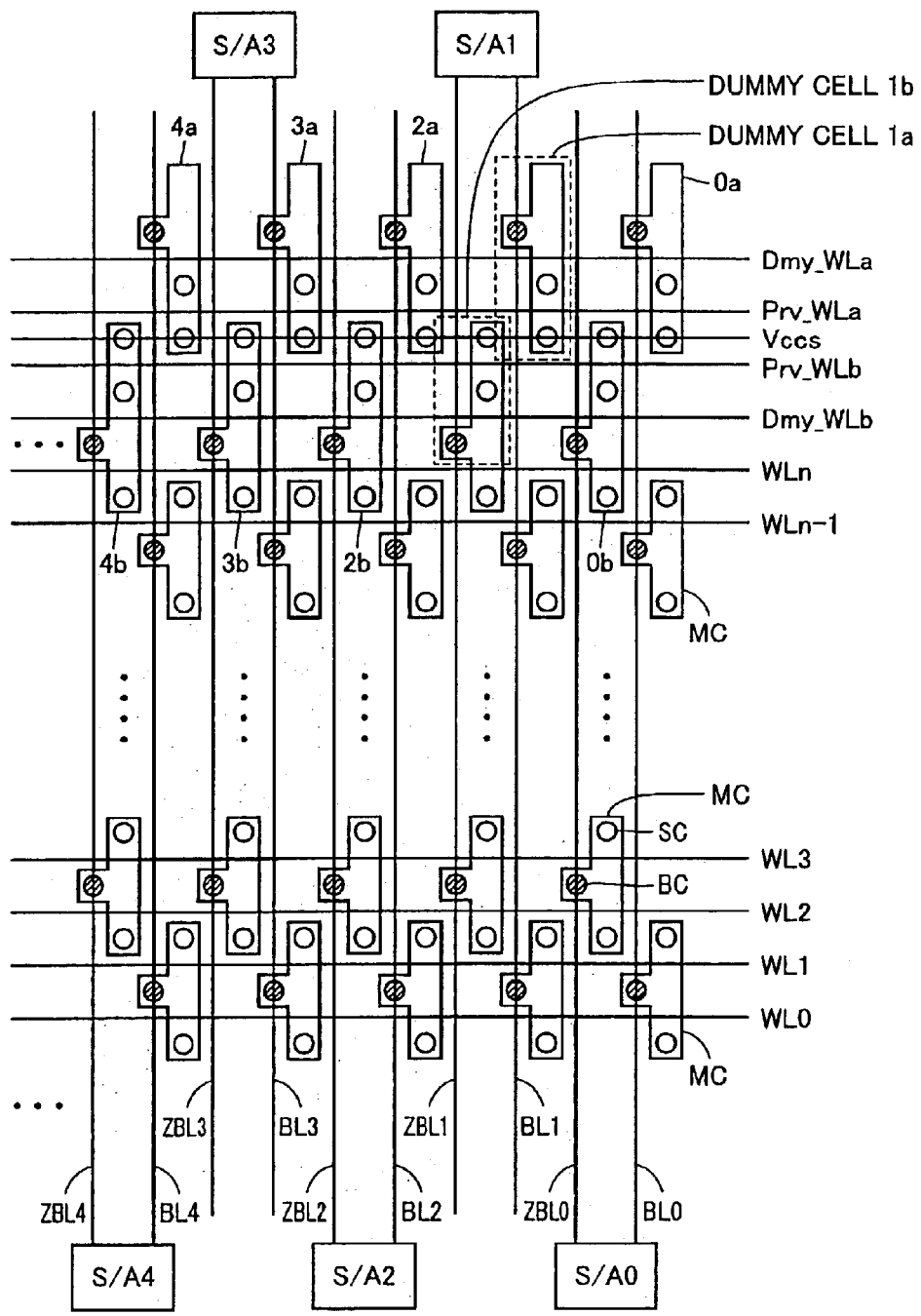
FIG. 1 schematically shows a configuration of a memory array in a semiconductor memory device according to a first embodiment of the present invention.

In the following, embodiments of the present invention will be described in detail with reference to the figures. It is noted that the same reference characters refer to the same or corresponding components in the figures.

First Embodiment

FIG. 1 schematically shows a configuration of a memory array in a semiconductor memory device according to the first embodiment of the present invention.

It is to be noted that all configurations of the semiconductor memory device in the present first embodiment described below adopt the Vss precharge scheme.

Referring to FIG. 1, a plurality of normal memory cells MC storing 1-bit data respectively are arranged in matrix in the memory array. Word lines WL0–WLn (n is a natural number) are disposed corresponding to each row of normal memory cell MC, and bit line pairs BL0, ZBL0–BL4, ZBL4 . . . are disposed corresponding to a column of normal memory cell MC respectively. Here, it is assumed that the memory array in the present embodiment is configured with what, is called a "half-pitch cell arrangement."

As shown in FIG. 1, in the half-pitch cell arrangement, normal memory cell MC is arranged at regular intervals at an intersection of two word lines WL and one bit line BL or ZBL. More specifically, adjacent bit lines BL and ZBL constitute the bit line pair, and normal memory cell MC is arranged at the intersection of bit line BL and word lines WL4$m$ ($m$ is a natural number) and WL4$m$+1. Normal memory cell MC is arranged at the intersection of bit line ZBL and word lines WL4$m$+2 and WL4$m$+3.

In addition, as the reference voltage generating circuit injecting charges to respective bit line pairs BL0, ZBL0–BL4, ZBL4 . . . to generate the reference voltage, dummy cells consisting of dummy cells 0$a$–4$a$ . . . and dummy cells 0$b$–4$b$ . . . are arranged in the memory array. In the following, dummy cells 0$a$–4$a$ . . . are also collectively referred to simply as a dummy cell a. Dummy cells 0$b$–4$b$ . . . are also collectively referred to simply as a dummy cell b.

For example, in one bit line pair BL1, ZBL1, dummy cell 1a controlled by a dummy word line a (Dmy_WLa) and a dummy precharge line a (Prv_WLa) is connected to bit line BL1. In addition, a dummy cell 1b controlled by a dummy word line b (Dmy_WLb) and a dummy precharge line b (Prv_WLb) is connected to bit line ZBL1.

As described above, dummy cell a and dummy cell b are connected in pair to each bit line pair.

In order to avoid a complicated manufacturing process, a basic structure and layout of dummy cell a and dummy cell b is the same as that of normal memory cell MC, and a configuration with well-disciplined pattern regularity is adopted.

Therefore, as shown in FIG. 1, dummy cell a and dummy cell b include a storage node contact (SC) for coupling a storage node storing information to a cell plate electrode receiving a cell plate voltage VCP, and a bit line contact (BC) for coupling an access transistor within the dummy cell to the bit line, as in normal memory cell MC.

Moreover, dummy cell a and dummy cell b are different from normal memory cell MC in that they include a third contact (3rdCON) in addition to these contacts. In adopting the Vss precharge scheme, the third contact serves to connect an n-type diffusion layer formed on the surface of a semiconductor substrate to the Vccs power supply line in dummy cells a, b, as described below.

In addition, sense amplifiers S/A0, S/A1, S/A2 . . . for performing data read and data write are arranged, corresponding to each bit line pair BL, ZBL. In the following, a reference character S/A is used for collectively denoting these sense amplifiers.

In data write, sense amplifier S/A corresponding to a selected memory cell supplies complementary voltages to respective complementary bit lines constituting the corresponding bit line pair. On the other hand, in data read, the sense amplifier corresponding to the selected memory cell amplifies the difference in voltages read to corresponding complementary bit lines respectively.

In the semiconductor memory device with such a configuration, as described later, dummy cell a and dummy cell b are read at a timing just before a timing of data read of the normal memory cell, performed at the beginning of a data write and data read cycle. Thus, the potentials of complementary bit lines constituting the bit line pair are shifted by a read potential of dummy cells a, b from the Vss level which is the precharge potential, respectively.

Figure 2:
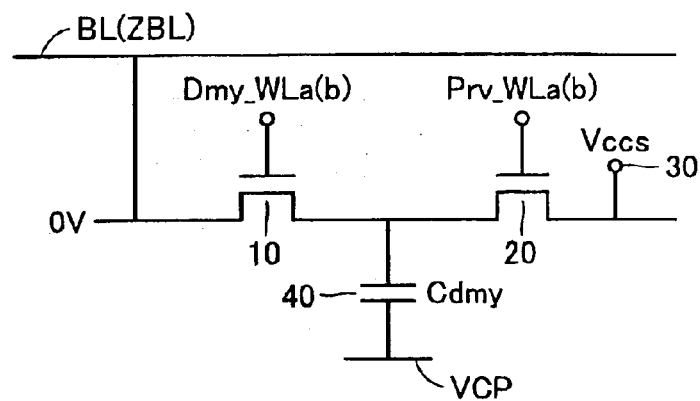
FIG. 2 shows one example of a configuration of a dummy cell shown in FIG. 1.

FIG. 2 shows one configuration example of dummy cell a shown in FIG. 1. Here, dummy cell a and dummy cell b have the same configuration, and can be described in a similar manner, when representations of dummy word line Dmy_WLa, dummy precharge line Prv_WLa and bit line BL shown in FIG. 2 are replaced as Dmy_WLb, Prv_WLb, and ZBL shown in parentheses respectively.

Referring to FIG. 2, dummy cell a includes an access transistor 10 connected between bit line BL and the storage node for storing charges, and having the gate connected to dummy word line Dmy_WLa, an access transistor 20 connected between the storage node and the Vccs power supply line, and having the gate connected to dummy precharge line Prv_WLa, and a dummy cell capacitor Cdmy constituted with the storage node and the cell plate electrode receiving cell plate voltage VCP.

Here, dummy cell capacitor Cdmy has the same structure and the capacitance as the cell capacitor in normal memory cell MC. Thus, a problem in manufacturing the dummy cell capacitor having a capacitance half the cell capacitor, that occurred in the conventional Vss (or Vcc) precharge scheme, can be avoided. In addition, the dummy cell capacitor can be manufactured with accuracy equal to that for the memory cell.

Figure 3:
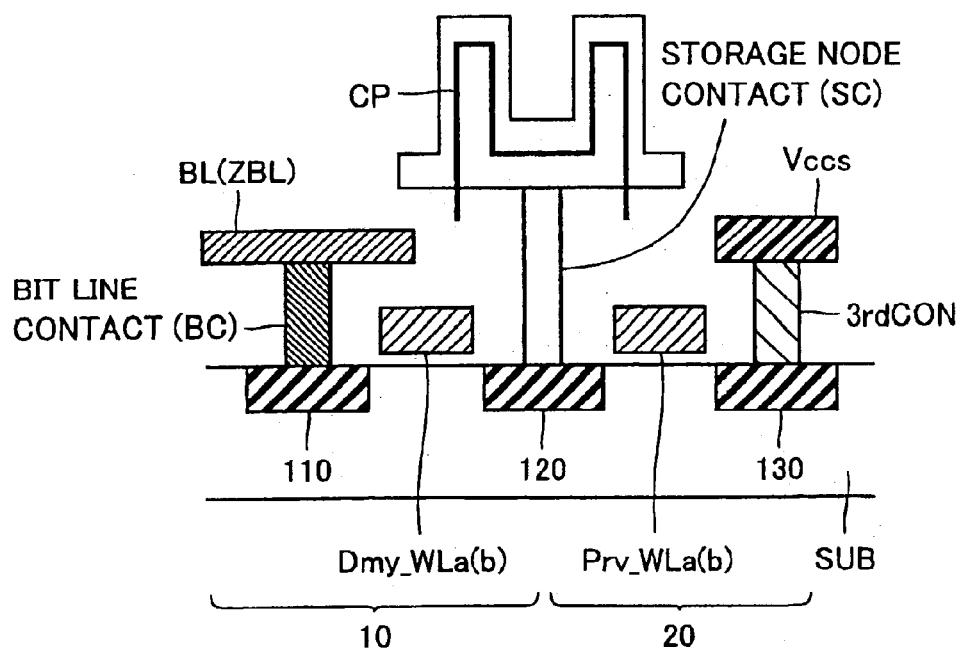
FIG. 3 schematically shows a cross-sectional structure of the dummy cell shown in FIG. 2.

FIG. 3 schematically shows a cross-sectional structure of dummy cell a shown in FIG. 2.

Here, a cross-sectional structure of dummy cell b can be described in a manner similar to FIG. 2, when a representation for each interconnection in FIG. 3 is replaced with that in the parentheses.

Referring to FIG. 3, n-type diffusion layers 110, 120, 130 are formed on the main surface of a semiconductor substrate SUB. Dummy word line Dmy_WLa is formed above a region between n-type diffusion layers 110 and 120. Dummy precharge line Prv_WLa is formed above a region between n-type diffusion layers 120 and 130.

N-type diffusion layers 110, 120 serve as the source/drain, and dummy word line Dmy_WLa serves as a gate electrode, to constitute an access transistor 10. On the other hand, n-type diffusion layers 120, 130 serve as the source/drain, and dummy precharge line Prv_WLa serves as a gate electrode, to constitute an access transistor 20.

In addition, above the storage node constituted with n-type diffusion layer 120, dummy cell capacitor Cdmy having a cell plate electrode (CP) with a three-dimensional structure is formed via storage node contact SC.

Here, the structure of the dummy cell capacitor is the same as that of the cell capacitor in normal memory cell MC. Therefore, the dummy cell capacitor can be manufactured with accuracy equal to that for normal memory cell MC also in the three-dimensional structure.

Figure 4:
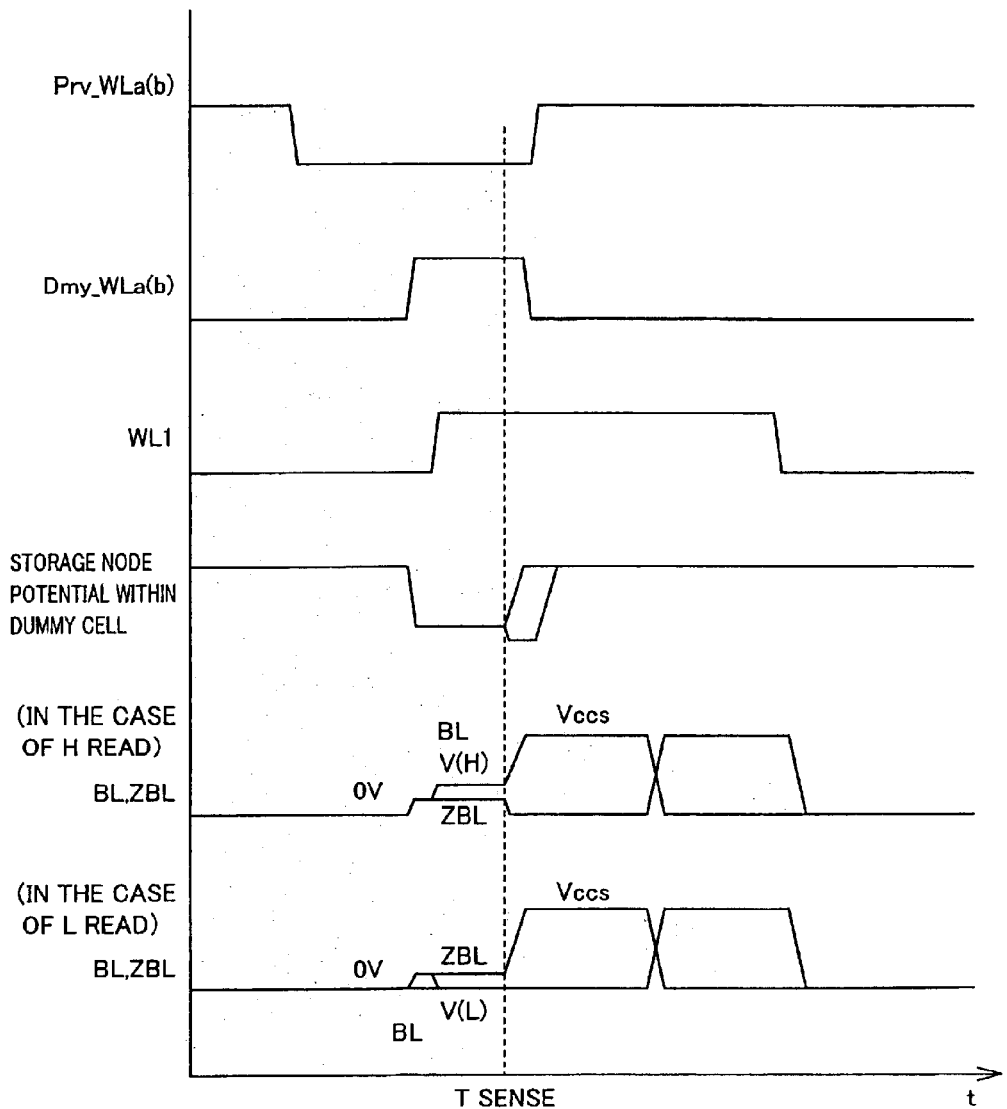
FIG. 4 is a timing chart illustrating a data write operation in the semiconductor memory device according to the first embodiment of the present invention.

FIG. 4 is a timing chart illustrating a data write operation in the semiconductor memory device with an above-described configuration, according to the first embodiment of the present invention.

First, bit line pair BL, ZBL is charged to a ground potential Vss level in stand-by, and disconnected from a not-shown charge circuit prior to the operation.

During stand-by, when dummy precharge line Prv_WLa is selected (comparable to H level) in dummy cell a shown in FIGS. 2 and 3, access transistor 20 turns on, and charges are stored from the Vccs power supply line to dummy cell capacitor Cdmy. Since dummy word line Dmy_WLa is in a non-selected state (comparable to L level) in stand-by, the storage node within dummy cell a is held at H level without discharging. Here, H level data is written also in complementary dummy cell b, simultaneously with dummy cell a.

Next, when row active is started, dummy word lines Dmy_WLa, Dmy_WLb are driven to a selected state just before normal word line WL is selected. Dummy precharge lines Prv_WLa, Prv_WLb are inactivated (comparable to L level) before activation of the dummy word line, and charging to dummy cells a, b is stopped.

When respective access transistor 10 is turned on in dummy cells a, b, in response to activation of dummy word lines Dmy_WLa, Dmy_WLb, the storage node is electrically coupled to complementary bit lines BL, ZBL of the bit line pair respectively, and charges are injected to a corresponding bit line from the storage node via access transistor 10. Since the same amount of charges is injected to bit lines BL and ZBL, the potentials of complementary bit lines BL, ZBL constituting the bit line pair are raised to the same level.

In reading the dummy cell described above, an amount of change of potential ΔV that appears in bit line pair BL, ZBL is equal between bit line BL and paired bit line ZBL, and can be expressed in the following equation.

$$\Delta V = V cc/(1+Cb/Cs)$$

Here, Cs represents a capacitance of the capacitor in the normal memory cell and the dummy cell, and Cb represents a stray capacitance of each bit line.

In addition, when normal word line WL is selected in succession, in normal memory cell MC as well, the read potential appears in the bit line having the normal memory cell connected, in accordance with data stored in the cell capacitor.

When the data written in the normal memory cell is at H level, the read potential of the normal memory cell here is expressed as $$\Delta V_H = V cc/(1+Cb/Cs), \text{ and}$$

when it is at L level, the read potential of the same is expressed as follows.

$$\Delta V_L = -V cc/(1+Cb/Cs)$$

Therefore, as shown in FIG. 4, for example, when the H data is read from the normal memory cell to bit line BL, the potential of bit line BL V(BL) will attain the sum of the read voltage of the dummy cell $\Delta V$ and the read voltage of the normal memory cell $\Delta V_H$, and is expressed as follows.

$$V(BL) = \Delta V + \Delta V_H = V cc/(1+Cb/Cs) + V cc/(1+Cb/Cs)$$

On the other hand, potential of paired bit line ZBL V(ZBL) will be set merely to the read voltage of the dummy cell $\Delta V$, and shown as below.

$$V(ZBL) = \Delta V = V cc/(1+Cb/Cs)$$

Thus, potential difference between the bit lines V(BL−ZBL) at the beginning of sensing is expressed as follows.

$$V(BL-ZBL) = V cc/(1+Cb/Cs)$$

The sense amplifier differentially amplifies the potential difference to perform polarity discrimination.

Meanwhile, when the L data is read from the normal memory cell to bit line BL as well, potential of bit line BL V(BL) attains the sum of read voltage of the dummy cell $\Delta V$ and read voltage of the normal memory cell $\Delta V_L$, and is expressed as follows.

$$V(BL) = V cc/(1+Cb/Cs) - V cc/(1+Cb/Cs) = 0$$

On the other hand, potential of paired bit line ZBL V(ZBL) remains as shown below $$V(ZBL) = V cc/(1+Cb/Cs)$$

Therefore, in reading the L data, potential difference between the bit lines V(BL−ZBL) is as shown below.

$$V(BL-ZBL) = -V cc/(1+Cb/Cs)$$

This potential difference is differentially amplified, and subjected to polarity discrimination.

The sensing operation in the semiconductor memory device in the present embodiment shown above will be described below, in comparison with the sensing operation when the conventional Vss precharge scheme is adopted.

In the conventional Vss precharge scheme, the capacitance of the capacitor in the dummy cell is half the cell capacitor in the normal memory cell. Therefore, the voltage read to the bit line when the dummy word line is selected is as follows.

$$\Delta V = \frac{1}{2} \cdot V cc/(1+Cb/Cs)$$

This value is comparable to an intermediate potential between read voltage of H level $\Delta V_H$ and read voltage of L level $\Delta V_L$ from the normal memory cell. Therefore, potential difference between sensed bit lines V(BL−ZBL) is comparable to the difference from the read voltage of the normal memory cell, when read voltage of the dummy cell $\Delta V$ serves as the reference voltage, as shown below.

$$V(BL-ZBL) = |\frac{1}{2} \cdot V cc/(1+Cb/Cs)|$$

In other words, in the semiconductor memory device according to the first embodiment of the present invention, the potential difference between the bit lines sensed by the sense amplifier is comparable to twice the potential difference that has been sensed in the semiconductor memory device using the conventional Vss precharge scheme. Thus, the sense margin can be secured, and the high-speed sensing operation can be achieved, even if the power supply voltage is lowered.

In addition, in the conventional Vss or Vcc precharge scheme, it has been necessary to set the reference voltage to an intermediate value between two values, that is, H read voltage $\Delta V_H$ and L read voltage $\Delta V_L$. In the present embodiment, however, the potentials of the complementary bit lines constituting the bit line pair are equally raised for use as the reference voltage. Therefore, the reference voltage does not necessarily have to be an intermediate voltage between the two values.

Conventionally, it has been necessary to accurately manufacture the capacitor having half the capacitance of the cell capacitor. In the present embodiment, however, an absolute value itself of the capacitance of the capacitor is not limited, so long as dummy cells a and b have the same capacitance. Therefore, a problem in manufacturing due to higher integration will be solved.

The data write operation shown above is performed in the semiconductor memory device employing the Vss precharge scheme. When the Vcc precharge scheme is adopted, a similar effect can be obtained by setting third contact 3rdCON to the ground potential Vss level in the configuration of dummy cells a, b in FIG. 2. In other words, a sufficient sense margin can be secured even under the low power supply voltage, if a potential obtained by lowering the potentials of complementary bit lines BL, ZBL of the bit line pair by Vcc/(1+Cb/Cs) from the Vcc level, which is the precharge voltage, is used as the reference potential.

The H data written in dummy cells a, b continues to be charged through access transistor 20 in FIG. 2 during a stand-by period. Therefore, a refresh operation for dummy cells a, b is not necessary.

In addition, dummy precharge lines Prv_WLa, Prv_WLb are activated immediately after sensing, while dummy word lines Dmy_WLa, Dmy_WLb are inactivated, so that charging to dummy cells a, b is started. Therefore, extension of the cycle time caused by charging into each dummy cell does not take place.

As described above, according to the semiconductor memory device in the first embodiment of the present invention, in the Vcc or Vss precharge scheme, a path is provided for providing and receiving charges to/from complementary bit lines constituting the bit line pair to provide and receive the same amount of charges to/from respective bit lines before data read, and the potentials of the complementary bit lines are shifted so as to attain the same level. Thus, decrease of the sense margin due to the lowered power supply voltage can be avoided, and the high-speed sensing can be achieved.

Second Embodiment

Figure 5:
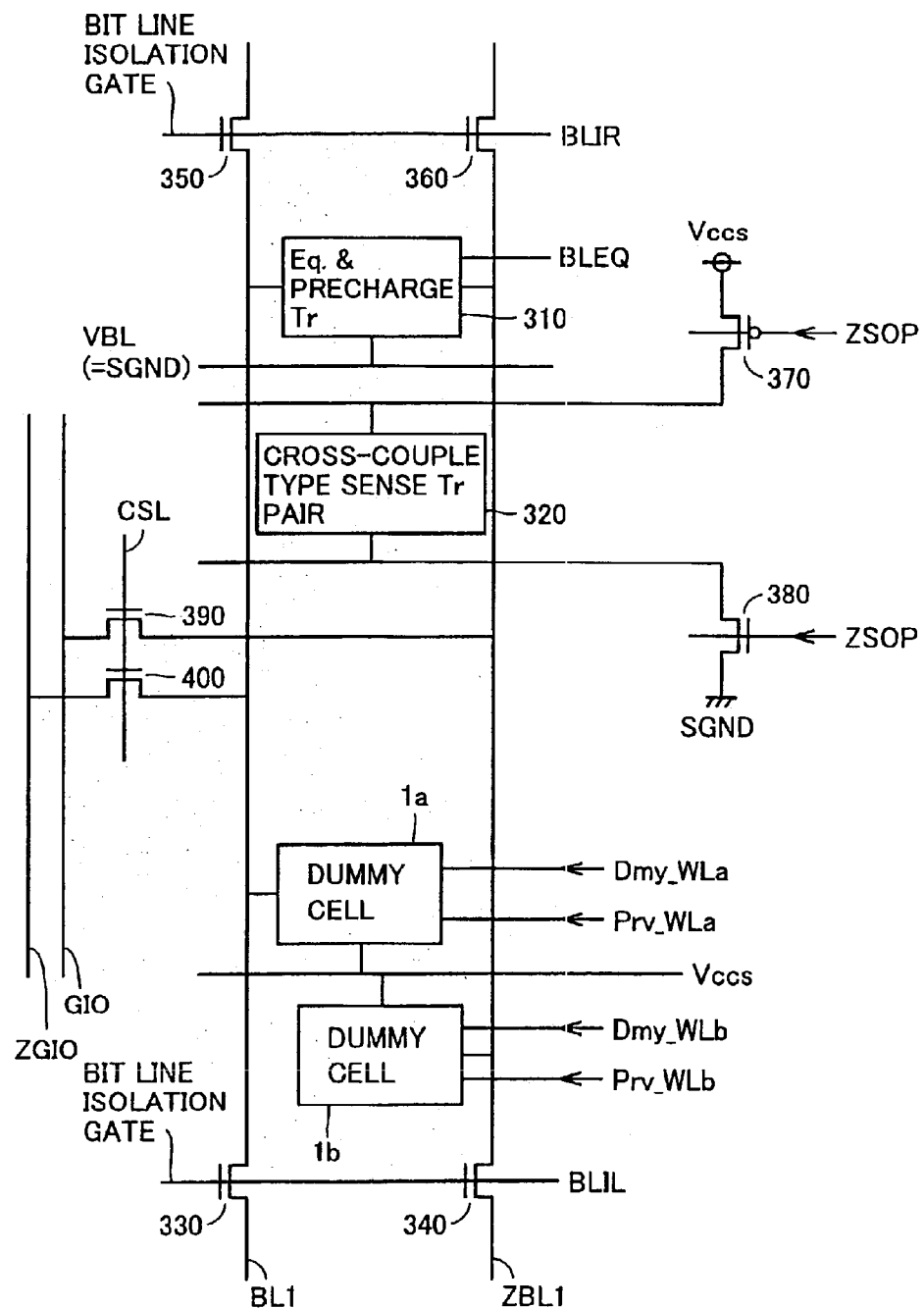
FIG. 5 schematically shows a configuration of a sense amplifier in a semiconductor memory device according to a second embodiment of the present invention.

FIG. 5 schematically shows a configuration of a sense amplifier of a semiconductor memory device according to the second embodiment of the present invention.

Referring to FIG. 5, the sense amplifier has a shared sense amplifier configuration in which the bit lines are divided by a bit line isolation gate and the sense amplifier is shared by adjacent bit lines. The divided bit line pair is selectively connected/isolated to/from the sense amplifier by isolation instruction signals BLIR, BLIL input to bit line isolation gates 350, 360 and bit line isolation gates 330, 340 respectively.

As shown in FIG. 5, the sense amplifier includes an Eq. & precharge Tr 310 performing an equalizing/precharging operation of bit line pair BL, ZBL, and a cross-couple type sense transistor pair 320 differentially amplifying the potential difference between the bit lines.

Cross-couple type sense transistor pair 320 is further connected to the drains of a P-channel type MOS transistor 370 and an N-channel type MOS transistor 380. P-channel type MOS transistor 370 has the source connected to the Vccs power supply line, and has the gate electrode connected to a sense amplifier driving line ZSOP. N-channel type MOS transistor 380 has the source connected to a ground voltage level SGND, and has the gate electrode connected to sense amplifier driving line ZSOP.

Here, bit line pair BL, ZBL is electrically coupled to an input/output line pair ZGIO, GIO respectively, when transfer gates 390, 400 turn on in response to an activated column select signal CSL.

In addition, as shown in FIG. 5, the semiconductor memory device of the second embodiment is different from that of the first embodiment in that it includes dummy cells a, b serving as the reference voltage generating circuit within the sense amplifier, which was arranged in the memory array.

Therefore, by adopting the configuration of the sense amplifier in FIG. 5, in the configuration of a not-shown memory array in the semiconductor memory device of the second embodiment, dummy cells a, b are removed from the memory array in the first embodiment.

Figure 6:
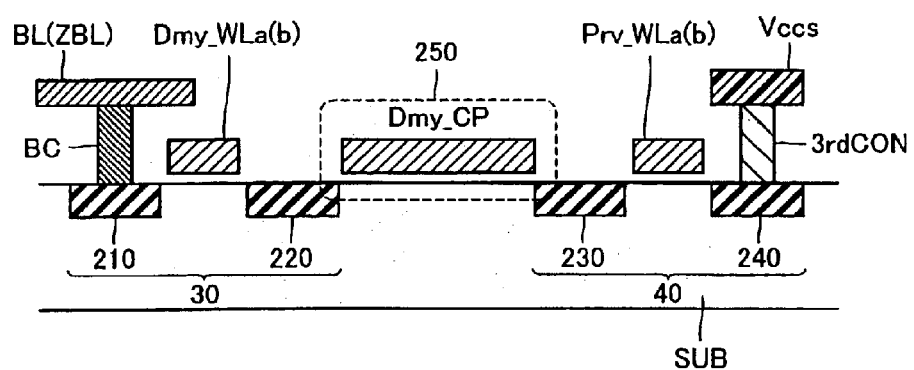
FIG. 6 schematically shows a cross-sectional structure of a dummy cell shown in FIG. 5.

FIG. 6 schematically shows a cross-sectional structure of dummy cell a shown in FIG. 5.

Here, a cross-sectional structure of dummy cell b is shown by replacing the representation of each interconnection in FIG. 5 with that in parentheses, and a basic structure is similar.

Referring to FIG. 6, n-type diffusion layers 210, 220, 230, 240 are formed on the main surface of semiconductor substrate SUB, and dummy word line Dmy_WLa is formed above a region between n-type diffusion layers 210 and 220. Dummy precharge line Prv_WLa is formed above a region between n-type diffusion layers 230 and 240.

In addition, a cell plate electrode Dmy_CP for dummy cell a is formed above a region between n-type diffusion layers 220 and 230 via a not-shown capacitor oxide film.

N-type diffusion layers 210, 220 serve as the source/drain, and dummy word line Dmy_WLa serves as the gate electrode, to constitute an access transistor 30. On the other hand, n-type diffusion layers 230, 240 serve as the source/drain, and dummy precharge line Prv_WLa serves as the gate electrode, to constitute an access transistor 40.

The region between n-type diffusion layers 220 and 230 serves as a storage node region. The storage node region, the electrode Dmy_CP extending in parallel with dummy word line Dmy_WLa, and the not-shown capacitor oxide film directly under dummy cell plate electrode Dmy_CP constitute a capacitor 250 with a planar-type structure.

The present embodiment is different, with respect to the configuration of the dummy cell in the first embodiment, only in that the planar-type capacitor structure is employed for capacitor 250, and that dummy cell plate electrode Dmy_CP is formed in the same interconnection layer as dummy word line Dmy_WLa and dummy precharge line Prv_WLa.

In the first embodiment, the dummy cell was arranged within the memory array, and the cell was configured in a manner similar to the normal memory cell, whereby pattern regularity was maintained, and manufacturing process was simplified. In the present embodiment, however, all interconnection layers of the dummy cell can be formed in the same manufacturing process step. Therefore, manufacturing process can be simplified without adding a new interconnection layer.

In addition, in the present embodiment, the dummy cell is shared by the adjacent bit line pairs among the divided bit line pairs. Therefore, a circuit size can be made smaller, compared to the configuration in the first embodiment in which the dummy cell is arranged for individual bit line pair.

Here, the write and read operation of the dummy cell in the semiconductor memory device in the present embodiment is the same as in the dummy cell in the first embodiment. In addition, an operation waveform diagram in data write is the same as that shown in FIG. 4.

Specifically, in stand-by, in dummy cells a, b shown in FIG. 6, dummy precharge lines Prv_WLa, Prv_WLb are selected (comparable to H level), and access transistor 40 is turned on. Thus, charges are stored in capacitor 250 from the Vccs power supply line, and the potential of the storage node is held at H level.

Next, when row active is started, dummy word lines Dmy_WLa, Dmy_WLb are selected just before word line WL is selected. Here, dummy precharge lines Prv_WLa, Prv_WLb are inactivated (comparable to L level), and charging to dummy cells a, b is stopped.

When access transistor 30 turns on and the storage node is electrically coupled to complementary bit lines BL, ZBL respectively in response to activation of dummy word lines Dmy_WLa, Dmy_WLb, charges move from the storage node via access transistor 30 to each bit line BL, ZBL. Moreover, the potentials of complementary bit lines BL, ZBL constituting the bit line pair are raised respectively.

The amount of change in the potentials of bit lines BL, ZBL here is equal between the bit lines, and is the same as that in the semiconductor memory device in the first embodiment.

As described above, according to the semiconductor memory device in the second embodiment of the present invention, the potentials of the complementary bit lines constituting the bit line pair can be shifted to the same level by forming the dummy cell within the sense amplifier without changing a pattern in the memory array.

In addition, the dummy cell provided in the sense amplifier adopts the planar-type capacitor structure, and interconnection of the cell plate electrode is carried out in the same process as another interconnection. Therefore, manufacturing process can be simplified without adding a new interconnection layer.

Moreover, in the semiconductor memory device with the shared sense amplifier configuration, the dummy cell is shared by the adjacent bit line pairs. Therefore, an increase of the circuit size by disposing the dummy cell can be suppressed.

Third Embodiment

Figure 7:
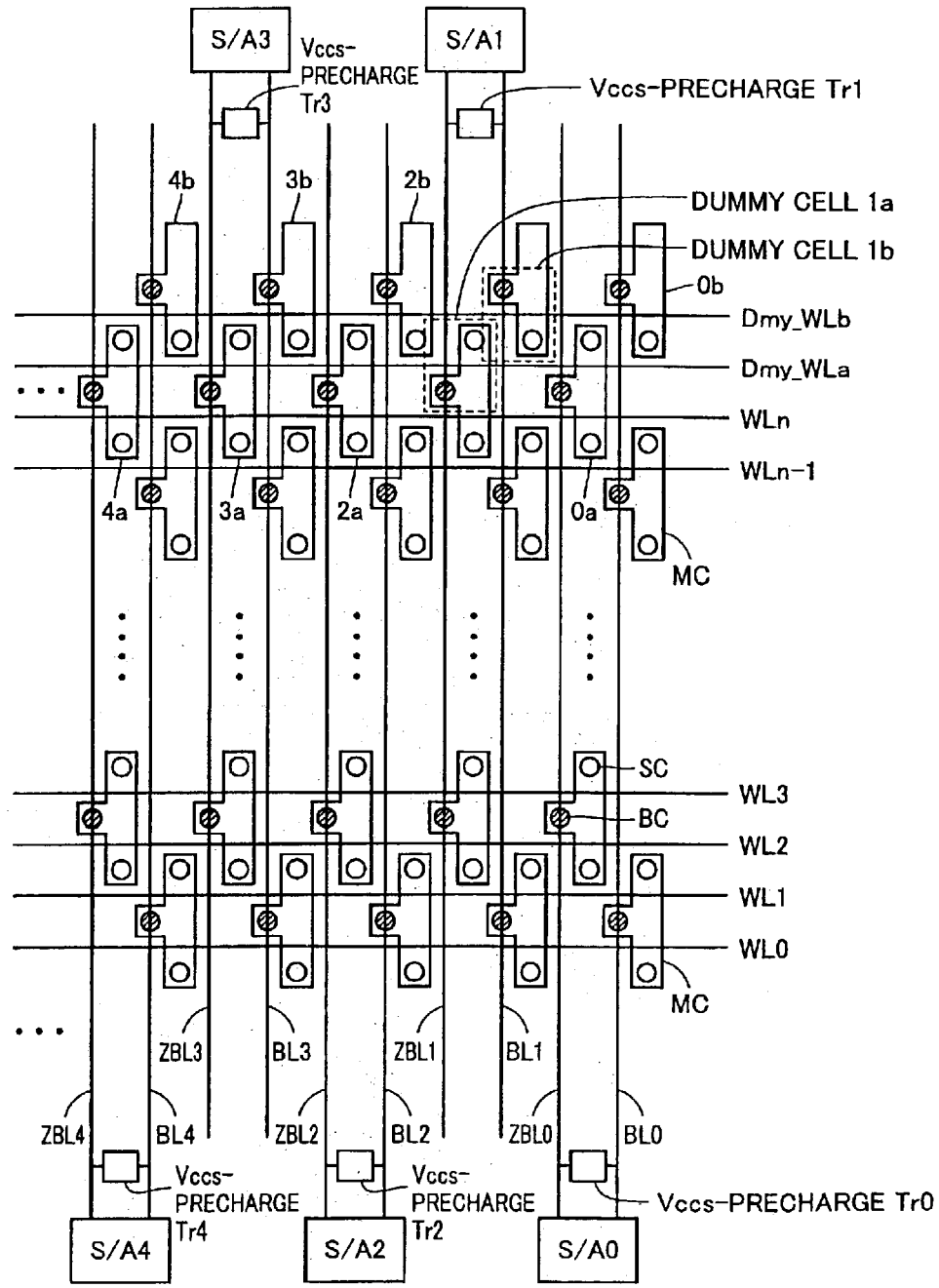
FIG. 7 schematically shows a configuration of a memory array in a semiconductor memory device according to a third embodiment of the present invention.

FIG. 7 schematically shows a configuration of a memory array of a semiconductor memory device according to the third embodiment of the present invention. It is to be noted that the semiconductor memory device in the present embodiment employs the Vss precharge scheme.

Referring to FIG. 7, the memory array in the semiconductor memory device in the third embodiment is different from that in the first embodiment in that dummy cells a, b have the same configuration as the normal memory cell, and that a Vccs-precharge transistor is newly provided adjacent to sense amplifier S/A at one end of the bit line pair. Description for components common to both embodiments will not be repeated.

As shown in FIG. 7, Vccs-precharge Tr 0, 1, 2, 3, 4 . . . are arranged for each bit line pair BL0, ZBL0-BL4, ZBL4 . . . , and connected to complementary bit lines respectively. In the following, these Vccs-precharge Tr 0, 1, 2, 3 . . . are also collectively referred to simply as Vccs-precharge Tr.

Meanwhile, dummy cells a, b have the same configuration as normal memory cell MC, because Vccs-precharge Tr attaining a function similar to access transistor 20 in FIG. 2 is provided outside the dummy cell. Referring to FIG. 7, for example, dummy cell 1a is arranged in a region where bit line pair BL1, ZBL1 intersects dummy word line Dmy_WLa, while dummy cell 1b is arranged in a region where bit line pair BL1, ZBL1 intersects dummy word line Dmy_WLb.

In the above configuration, Vccs-precharge Tr electrically couples the Vccs power supply line to complementary bit lines BL, ZBL of the bit line pair in response to an activated dummy precharge signal, and precharges each bit line to the Vcc level, as described later. In addition, concurrently, when bit lines BL, ZBL are electrically coupled to the storage node within dummy cells a, b respectively in response to activated dummy word lines Dmy_WLa, Dmy_WLb, dummy cells a, b in the memory array are charged to the Vcc level by each bit line respectively.

Figure 8:
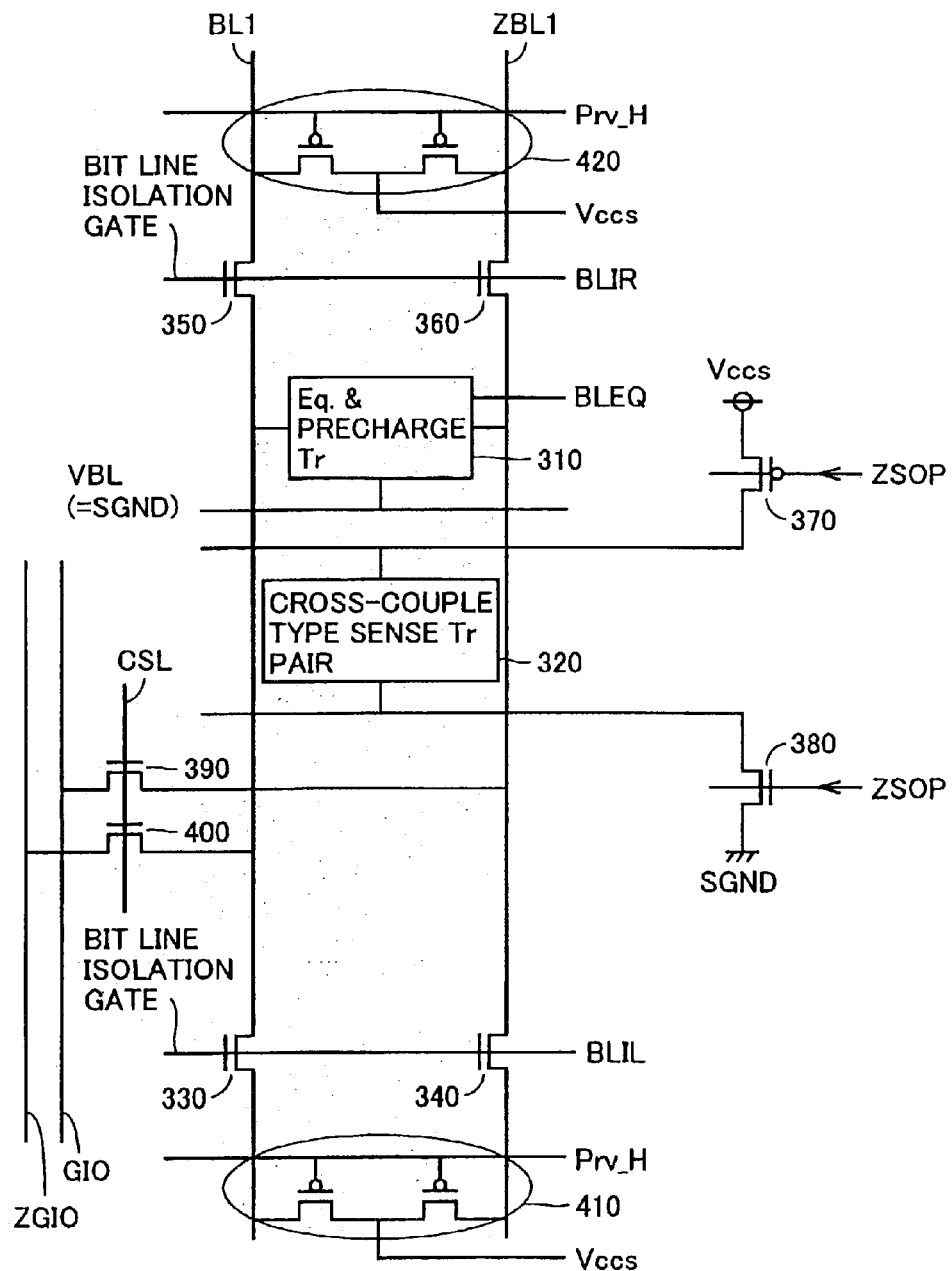
FIG. 8 schematically shows a configuration of a sense amplifier of the semiconductor memory device having a Vccs-precharge transistor shown in FIG. 7.

FIG. 8 schematically shows a configuration of the sense amplifier of the semiconductor memory device including the Vccs-precharge Tr in FIG. 7.

Referring to FIG. 8, the sense amplifier in the semiconductor memory device in the present embodiment has the shared sense amplifier configuration as in the second embodiment shown in FIG. 5. On the other hand, it is different in that dummy cells a, b that were provided within the sense amplifier are arranged in the memory array, and that Vccs-precharge Tr is formed on a side of the sense amplifier at one end of the divided bit line pair. Note that description for components common to both embodiments will not be repeated.

As shown in FIG. 8, Vccs-precharge Tr 410, 420 are formed corresponding to the divided bit line pair respectively, and consist of the P-channel type MOS transistor connected in parallel between complementary bit lines BL, ZBL.

A connection node between two P-channel type MOS transistors is further connected to the Vccs power supply line. In addition, the gate electrode is connected to a dummy precharge signal line Prv_H respectively.

In Vccs-precharge Tr 410, 420 with the above configuration, in response to fall of a dummy precharge signal Prv_H to L level, P-channel type MOS transistors are together turned on. Thus, the Vccs power supply line is electrically coupled to bit line pair BL, ZBL, and complementary bit lines BL, ZBL are charged to the Vcc level via the P-channel type MOS transistor respectively.

Here, dummy word lines Dmy_WLa, Dmy_WLb are both active, as described later. Therefore, bit lines BL, ZBL are electrically coupled to the storage node in dummy cells a, b respectively. Dummy cells a, b are charged by bit lines BL, ZBL at the Vcc level, and consequently, H level data is written therein.

In addition, dummy word lines Dmy_WLa, Dmy_WLb are inactivated after the write operation ends, and then, an active cycle is terminated. Thus, the H level data is held in the dummy cell for a next cycle.

Here, Vccs-precharge Tr 410, 420 comply with the Vss precharge scheme, and are constituted with two P-channel type MOS transistors respectively. When the Vcc precharge scheme is adopted, two N-channel type MOS transistors may constitute a Vss-precharge Tr, and a connection node for the both may be connected to ground potential Vss (=SGND).

In such a case, when dummy precharge signal Prv_H rises to H level, N-channel type MOS transistors are together turned on, and ground potential Vss is electrically coupled to bit lines BL, ZBL. Thus, each bit line attains the Vss level. In addition, since each bit line is electrically coupled to the storage node in response to the activated dummy word line, L level data is written in the dummy cell. Then, the cycle is terminated.

Figure 9:
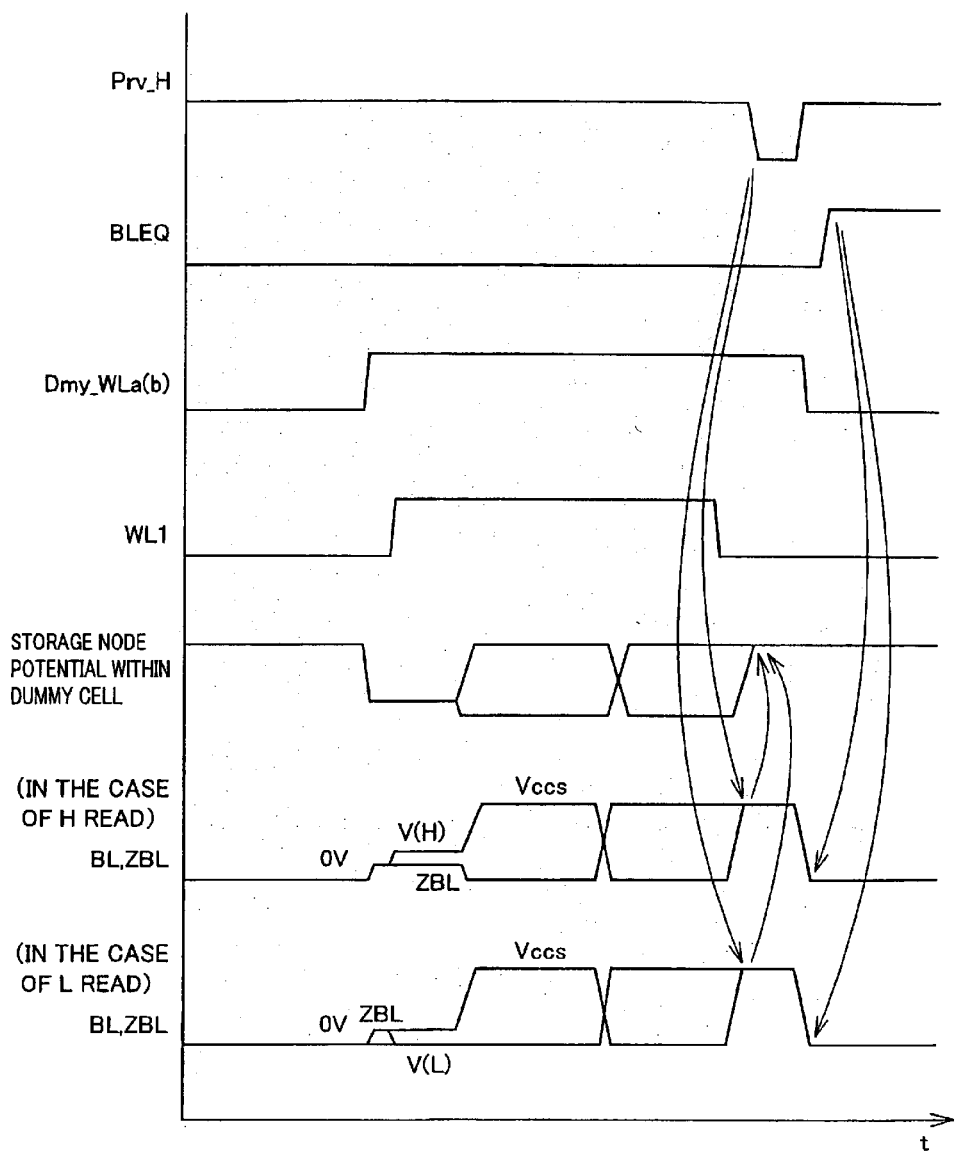
FIG. 9 is a timing chart illustrating a data write operation in the semiconductor memory device according to the third embodiment of the present invention.

FIG. 9 is a timing chart illustrating a data write operation in the semiconductor memory device according to the third embodiment of the present invention.

Referring to FIG. 9, initially, prior to the operation, complementary bit lines BL, ZBL are precharged to L level, in response to a bit line equalizing & precharging signal BLEQ activated after the previous active cycle ends.

Here, the storage node of dummy cells a, b holds H level data written by activated dummy precharge signal Prv_H, just before the active cycle ends, as described later.

Here, when dummy word lines Dmy_WLa, Dmy_WLb are selected just before row active is started and normal word line WL is selected, as shown in the first embodiment, a potential comparable to the sum of the read voltage from the normal memory cell and the read voltage from the dummy cell appears in one of complementary bit lines BL, ZBL of the bit line pair, while the potential comparable only to the read voltage from the dummy cell appears to the other thereof. It is to be noted that the read voltage here is the same as that shown in the semiconductor memory device in the first embodiment.

Therefore, the sense amplifier differentially amplifies the potential difference between the complementary bit lines to perform a read operation, and holds a cell amplification voltage once in respective bit lines. Then, the sense amplifier forcibly replaces the amplification voltage on the bit line selected thereafter with an external write information voltage, for input to the capacitor of the selected cell.

The aforementioned write operation is the same as that in the semiconductor memory device in the first embodiment shown in FIG. 4. On the other hand, the semiconductor memory device is different from that in the first embodiment in that charging to the storage node within the dummy cell is carried out at the end of the cycle.

In the following, details of the charging operation in the semiconductor memory device in the present embodiment will be described.

As shown in FIG. 8, at the end of the cycle after the write operation ends and word line WL is inactivated, dummy word lines Dmy_WLa, Dmy_WLb maintain an active state. Concurrently, dummy precharge signal Prv_H is activated (comparable to L level).

When Vccs-precharge Tr in FIG. 7 is turned on upon receiving the activated dummy precharge signal Prv_H at the gate, it electrically couples the Vccs power supply line to the bit line, and charges the potentials of complementary bit lines BL, ZBL to H level. In addition, since dummy word lines Dmy_WLa, Dmy_WLb maintain the active state, bit lines BL, ZBL are electrically coupled to the storage node of dummy cells a, b respectively, and H level data is written in dummy cells a, b from bit lines BL, ZBL respectively.

Next, when data write into dummy cells a, b ends, the semiconductor memory device inactivates dummy word lines Dmy_WLa, Dmy_WLb as well as dummy precharge signal Prv_H (comparable to H level). Thus, Vccs-precharge Tr is turned off. Accordingly, the potential of the storage node in dummy cells a, b is held at H level.

When the cycle ends and a stand-by state is established after a series of operations in the above have ended, the semiconductor memory device activates the bit line equalizing signal, and turns on Eq. & precharge Tr in the sense amplifier. In addition, the semiconductor memory device equalizes and precharges bit lines BL, ZBL to the ground potential Vss level, and prepares for the active cycle.

As described above, according to the semiconductor memory device in the third embodiment of the present invention, when the active cycle ends, complementary bit lines BL, ZBL are charged, and the write operation into the dummy cell is performed utilizing those charges. Therefore, the cycle time is extended by a duration of the write operation, compared to the semiconductor memory device in the first embodiment. On the other hand, since the write operation is performed by Vccs-precharge Tr provided in the sense amplifier, dummy cells a, b in the memory array may be formed with a pattern identical to the normal memory cell, thus avoiding a complicated manufacturing process.

Fourth Embodiment

Figure 10:
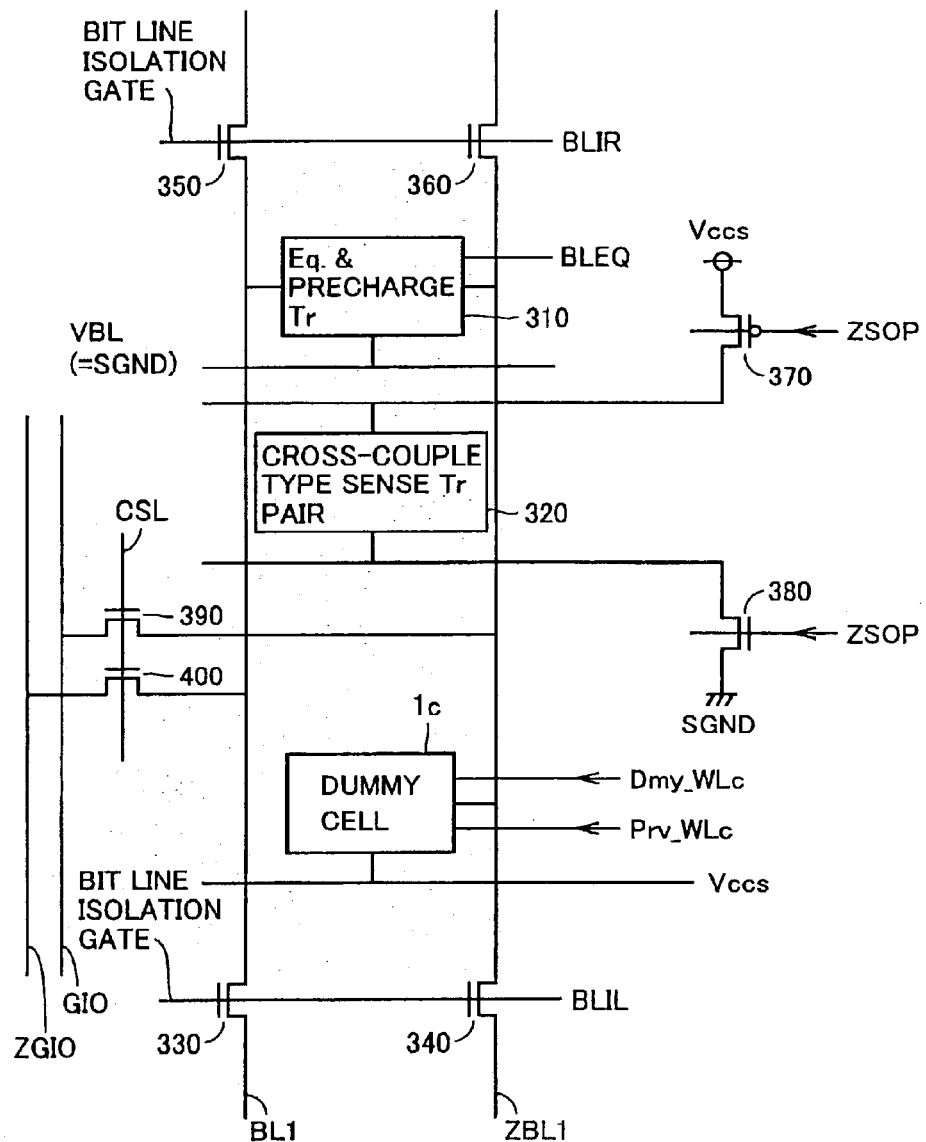
FIG. 10 schematically shows a configuration of a sense amplifier of a semiconductor memory device according to a fourth embodiment of the present invention.

FIG. 10 schematically shows a configuration of a sense amplifier according to a semiconductor memory device in the fourth embodiment of the present invention.

Referring to FIG. 10, the sense amplifier in the semiconductor memory device in the fourth embodiment is different from that in the second embodiment shown in FIG. 5 in that a pair of dummy cells a, b are replaced with one dummy cell c. Description for components common to both embodiments will not be repeated. In the following, dummy cells 0c, 1c, 2c, . . . are also collectively referred simply as dummy cell c.

As shown in FIG. 10, two dummy cells a, b are combined to one. Therefore, the interconnection layer disposed in dummy cell c is simplified to a dummy word line Dmy_WLc and a dummy precharge line Prv_WLc, and in addition, the capacitor that is needed can be reduced in size. Thus, an area of the dummy cell itself can be made smaller.

Figure 11:
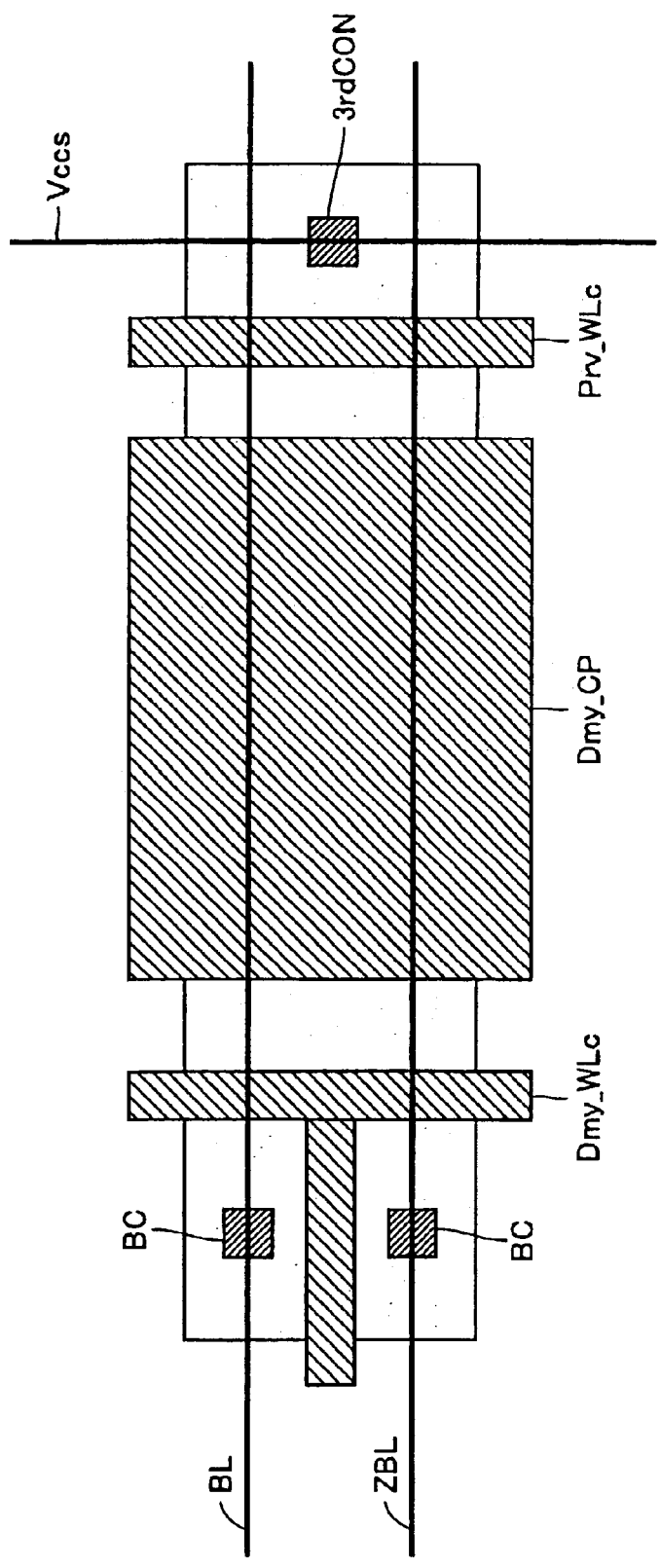
FIG. 11 schematically shows a configuration of the dummy cell in FIG. 10.

FIG. 11 schematically shows a configuration of dummy cell c in FIG. 10.

Dummy cell c has a structure basically similar to dummy cells a, b shown in FIG. 5. As shown in FIG. 11, dummy cell c includes third contact 3rdCON connecting the Vccs power supply line to the n-type diffusion layer formed on the surface of a semiconductor substrate region, as well as bit contacts BC connecting complementary bit lines BL, ZBL to the n-type diffusion layer. In addition, in dummy cell c, dummy precharge line Prv_WLc electrically coupling the Vcc power supply line to the capacitor, and dummy word line Dmy_WLc electrically coupling the capacitor to the bit line pair are interconnected.

The capacitor in dummy cell c has the planar-type capacitor structure, in which a storage electrode is formed with a storage node region (not shown) constituted with the n-type diffusion layer on the surface of the semiconductor substrate region, and dummy cell plate electrode Dmy_CP extends over complementary bit lines BL, ZBL in parallel with dummy word line Dmy_WLc and dummy precharge line Prv_WLc.

With such a configuration, cell plate electrode Dmy_CP, dummy word line Dmy_WLc, and dummy precharge line Prv_WLc are formed in the same manufacturing process step, in an identical interconnection layer. Therefore, a new interconnection layer for the cell plate electrode and the storage electrode does not have to be added, resulting in a simplified manufacturing process.

Here, the capacitor in dummy cell c is formed so as to have a capacitance twice the cell capacitor in normal memory cell MC. Thus, when dummy word line Dmy_WLc is active, charges are equally injected from dummy cell c to bit lines BL, ZBL, and the amount of charge injection is kept to the same as the amount of charge injection to each bit line described in the first and second embodiments.

In addition, dummy word line Dmy_WLc has a T-shaped interconnection structure consisting of a portion vertical to the bit line pair, for electrically coupling the capacitor to the bit line, and a portion for electrically coupling a bit line to another, located between complementary bit lines BL, ZBL.

With such a T-shaped interconnection structure, when dummy word line Dmy_WLc is activated, bit lines BL, ZBL are electrically connected to the cell capacitor respectively, and the bit lines are electrically connected to each other. Therefore, charges stored in the cell capacitor in dummy cell c are equally injected to bit line pair BL, ZBL respectively.

In other words, dummy word line Dmy_WLc serves to control a path for injecting charges to bit lines BL, ZBL, as well as to equalize bit line pair BL, ZBL.

In the above configuration, when dummy precharge line Prv_WLc is activated, H level data is written into the cell capacitor in dummy cell c through the Vccs power supply line. In succession, when dummy word line Dmy_WLc is activated, charges equally move from dummy cell c to respective bit lines BL, ZBL. Thus, the potentials of bit lines BL, ZBL shift from the Vss level to the same level respectively.

Here, in the semiconductor memory device including dummy cells a, b described in the second embodiment, potentials that appear in the bit lines may often be unbalanced due to variation in manufacture of the capacitor among the dummy cells. This could act as a noise source, and sensitivity may be deteriorated.

In order to avoid this, when a configuration in which complementary bit lines BL, ZBL shown in the present embodiment share the dummy cell is employed, such a problem of unbalance between the potentials can be solved, and deterioration of the sensitivity can be prevented.

Here, the present embodiment is different from the first and second embodiments in that dummy word line Dmy_WLc is inactivated just before the sensing operation.

This is because the bit lines that have been coupled in reading the dummy cell are electrically isolated in sensing operation.

As described above, according the configuration of the fourth embodiment of the present invention, one dummy cell is provided instead of the dummy cells arranged in complementary bit lines respectively, and that one dummy cell is shared by the bit lines. Thus, the circuit size of the dummy cell can be reduced. In addition, a problem of unbalance of the potentials among the bit lines is solved, and deterioration of sensitivity can be suppressed.

Fifth Embodiment

Figure 12:
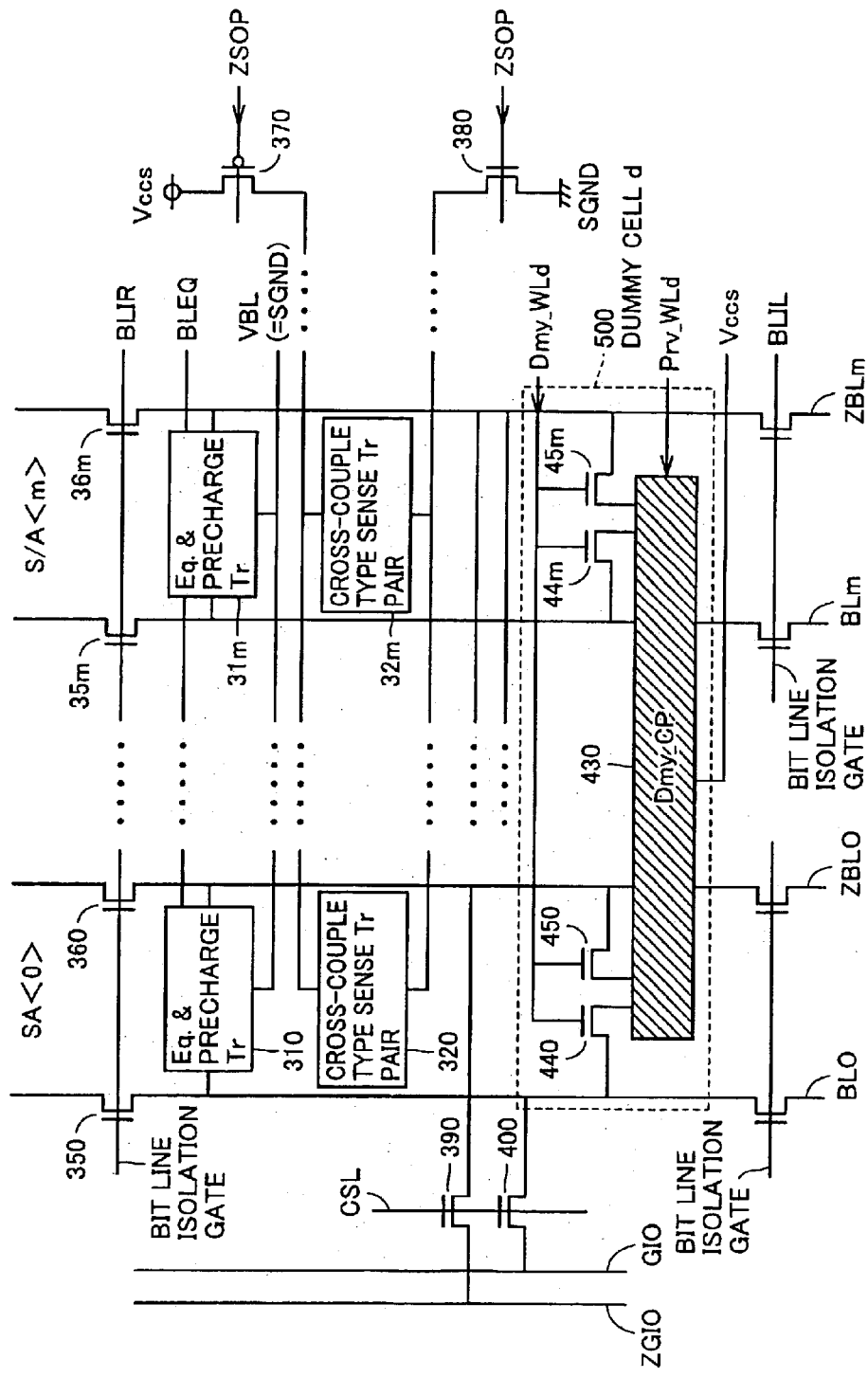
FIG. 12 schematically shows a configuration of a sense amplifier of a semiconductor memory device according to a fifth embodiment of the present invention.

FIG. 12 schematically shows a configuration of a sense amplifier according to a semiconductor memory device in the fifth embodiment of the present invention.

Referring to FIG. 12, a dummy cell d 500 in the semiconductor memory device in the fifth embodiment is similar to dummy cells a, b, c in the semiconductor memory devices in the second and fourth embodiments in that it is formed within the sense amplifier. On the other hand, it is different from dummy cells a, b, c in that one dummy cell is arranged for each of a plurality of sense amplifiers. Here, description for components common to the previous embodiments will not be repeated.

As shown in FIG. 12, dummy cell d 500 includes a dummy cell plate electrode Dmy_CP 430 formed over a plurality of bit line pairs BL, ZBL, and access transistors 440, 450–44m, 45m electrically coupling bit line pairs BL0, ZBL0–BLm, ZBLm (m is a natural number) to a dummy word line Dmy_WLd respectively.

When a dummy precharge line Prv_WLd is activated prior to the operation, the capacitor in dummy cell d 500 is charged from the Vccs power supply line. In addition, when row active is started and dummy word line Dmy_WLd is activated, access transistors 440, 450–44m, 45m are turned on simultaneously. Then, charges stored in the capacitor are equally distributed to bit lines BL0, ZBL0-BLm, ZBLm connected to respective transistors, and the potential of each bit line is shifted to the same level.

Figure 13:
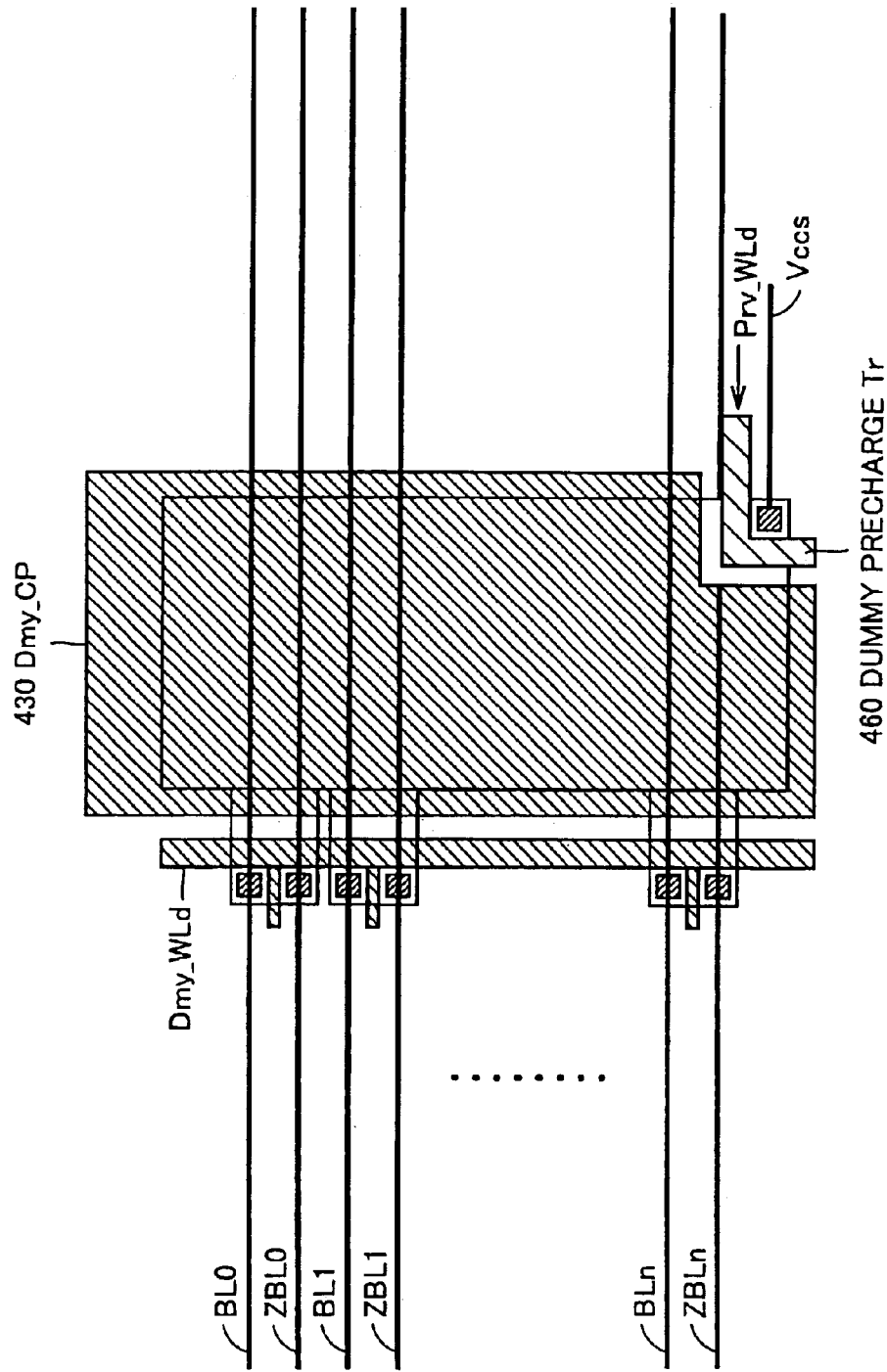
FIG. 13 shows a configuration example of a dummy cell in FIG. 12.

FIG. 13 shows a configuration example of dummy cell d 500 in FIG. 12.

The capacitor in dummy cell d 500 has the planar-type capacitor structure, as the capacitor in the dummy cell in the second and fifth embodiments shown in FIGS. 6 and 11. In the present embodiment, however, dummy cell plate electrode Dmy_CP 430 is formed on a field continuously extending over the plurality of bit line pairs BL, ZBL. Thus, the capacitor that is needed can be formed with a more compact dimension, compared to the configuration in which the capacitor is formed in the individual dummy cell.

In this configuration, the capacitance of the capacitor in the dummy cell is set to a value: (capacitance of the cell capacitor in the normal memory cell)×2×(the number of sense amplifiers connected to dummy cell d 500).

In addition, dummy word line Dmy_WLd has the T-shaped interconnection structure consisting of a portion vertical to the bit line, for electrically coupling the capacitor to the bit line, and a portion for electrically coupling a bit line to another, located between the complementary bit lines.

With a configuration as described above, a shifted amount of the potential that appears in each bit line pair BL, ZBL will be equal to that in the first to fourth embodiments, and moreover, will be the same among complementary bit lines.

In addition, a dummy precharge Tr 460 for performing Vccs precharge to the capacitor is formed in one portion of dummy cell d 500. As cell plate electrode Dmy_CP 430 is shared by a plurality of sense amplifiers, a single transistor can serve as a precharge Tr for charging the capacitor, as shown in FIG. 13. Therefore, an increase of the circuit size of the dummy cell can be suppressed.

During stand-by, when the Vccs power supply line is electrically coupled to the storage node of dummy cell d 500 in response to activation of dummy precharge line Prv_WLd, dummy cell d 500 in FIG. 13 precharges the capacitor to the Vcc level. In succession, when dummy word line Dmy_WLd is driven to a selected state, charges are equally injected to each bit line pair sharing the capacitor. Thus, the potentials among the complementary bit lines shift to the same level, and at the same time, shift to the same level among bit line pairs.

Here, in the sensing operation in which a slight potential level difference is differentially amplified, electrical unbalance among bit line pairs acts as a differential noise in a process of amplification. In addition, the unbalance will produce a difference in a speed of the sensing operation for each bit line pair.

Therefore, by shifting the potential of each bit line pair to the same level, as in the present embodiment, the differential noise as described above can be suppressed, and a stable operation can be secured.

Here, dummy word line Dmy_WLd is inactivated just before the sensing operation, and the bit lines in each bit line pair are electrically isolated, as in the fourth embodiment.

As described above, according to the semiconductor memory device in the fifth embodiment of the present invention, a configuration in which the cell capacitor in the dummy cell is shared by a plurality of sense amplifier is provided. Accordingly, the cell capacitor area and also the circuit size can be reduced, as well as a noise due to the unbalance of the potentials among bit line pairs can be suppressed. Thus, a stable and high-speed sensing operation can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a plurality of normal memory cells arranged in a matrix;
a plurality of first bit lines arranged in correspondence with a column of said normal memory cells, each pair of bit lines being connected to the normal memory-cells in a corresponding column;
a plurality of second bit lines respectively complementary to said plurality of first bit lines and arranged in correspondence with a column of said normal memory cells;
a plurality of normal word lines arranged in correspondence with a row of said normal memory cells, each normal word line being connected to the normal memory cell in a corresponding row;
a reference voltage generating circuit providing equal amounts of charge to and receiving equal amounts of charge from said plurality of first bit lines and said plurality of second bit lines, respectively, to generate a reference voltage, before any one normal word line, of said plurality of normal word lines, is selected; and
a sense amplifier differentially amplifying potential difference between said first bit line and second bit line, based on the reference voltage.

2. The semiconductor memory device according to claim 1, wherein said reference voltage generating circuit includes
a plurality of first dummy cells corresponding to each of said plurality of first bit lines and arranged in alignment with said normal memory cells,
a plurality of second dummy cells corresponding to each of said plurality of second bit lines, arranged in alignment with said normal memory cells, and having the same configuration as said plurality of first dummy cells, a first dummy word line coupled in common to said plurality of first dummy cells, and a second dummy word line coupled in common to said plurality of second dummy cells, wherein, before any normal word line of said plurality of normal word lines is selected, said first dummy word line and said second word line are driven to a selected state, and a read voltage of said plurality of first dummy cells and said plurality of second dummy cells serves as the reference voltage.

3. The semiconductor memory device according to claim 1, wherein each of said first and second dummy cells includes a first access transistor electrically coupling corresponding first and second bit lines to a storage electrode for storing charge, in response to activation of said first and second dummy word lines, a capacitor including the storage electrode and a cell plate electrode receiving a cell plate voltage, and a second access transistor electrically coupling said storage electrode to a voltage supply line.

4. The semiconductor memory device according to claim 3, further comprising a dummy precharge line parallel to said first and second dummy word lines, and coupled in common to a gate of a respective said second access transistor, wherein, in a waiting state in which data write and read of said normal memory cell is not performed, in response to activation of said dummy precharge line, said capacitor is precharged through the voltage supply line.

5. The semiconductor memory device according to claim 4, wherein said capacitor has the same capacitance as a capacitor in said normal memory cell.

6. The semiconductor memory device according to claim 4, wherein each of said plurality of first and second dummy cells is arranged in a memory array of said normal cells.

7. The semiconductor memory device according to claim 4, further comprising:

a first memory array including a plurality of first memory cell groups arranged in a matrix, a first bit line pair, and a first word line group intersecting said first bit line pair;

a second memory array including a plurality of second memory cell groups arranged in a matrix, a second bit line pair, and a second word line group intersecting said second bit line pair; and a shared sense amplifier shared by said first and second bit line pairs, wherein each of said plurality of first and second dummy cells is located within said shared sense amplifier.

8. The semiconductor memory device according to claim 2, further comprising:

a first memory array including a plurality of first memory cell groups arranged in a matrix, a first bit line pair, and a first word line group intersecting said first bit line pair;

a second memory array including a plurality of second memory cell groups arranged in a matrix, a second bit line pair, and a second word line group intersecting said second bit line pair; and a shared sense amplifier shared by said first and second bit line pairs, wherein said reference voltage generating circuit includes said plurality of first and second dummy cells, and said first and second dummy word lines, and before any one normal word line of said first and second word line groups is selected, said first dummy word line and said second dummy word line are driven to a selected state, and a read voltage of said plurality of first dummy cells and said plurality of second dummy cells serves as the reference voltage.

9. The semiconductor memory device according to claim 8, wherein each of said plurality of first and second dummy cells is located within said memory array, and includes a first access transistor electrically coupling corresponding first and second bit lines to a storage electrode for storing charge in response to activation of said first and second dummy word lines, and a capacitor including the storage electrode and a cell plate electrode receiving a cell plate voltage, and said shared sense amplifier includes a second access transistor arranged corresponding to each of said first and second bit line pairs, and connected between each of said first and second bit lines and a voltage supply line, and a dummy precharge line coupled to a gate of said second access transistor.

10. The semiconductor memory device according to claim 9, wherein said reference voltage generating circuit includes means for precharging each of said plurality of first and second bit lines from the voltage supply line at an end of a data write and read cycle of said normal memory cell, in response to activation of said dummy precharge line, means for maintaining said dummy word line driven to the selected state in an active state until the data write and read cycle ends, before any one normal word line of said first and second word line groups is selected, and means for precharging said capacitor within each of said plurality of first and second dummy cells from each of said plurality of first and second bit lines, in response to activation of said dummy word line.

11. The semiconductor memory device according to claim 1, further comprising:

a first memory array including a plurality of first memory cell groups arranged in a matrix, a first bit line pair, and a first word line group intersecting said first bit line pair;

a second memory array including a plurality of second memory cell groups arranged in a matrix, a second bit line pair, and a second word line group intersecting said second bit line pair; and a shared sense amplifier shared by said first and second bit line pairs, wherein said reference voltage generating circuit includes a plurality of dummy cells arranged in said shared sense amplifier, corresponding to each of said first and second bit line pairs, and arranged in alignment with said normal memory cells, and a dummy word line coupled in common to said plurality of dummy cells, and, before any one normal word line of said first and second word line groups is selected, said dummy word line is driven to a selected state, and a read voltage of said dummy cell, equally providing charge to and receiving charge from said first bit line and said second bit line serves as the reference voltage.

12. The semiconductor memory device according to claim 11, wherein each of said plurality of dummy cells includes a first access transistor electrically coupling respective first and second bit lines constituting each of said first and second bit line pairs to a storage electrode in response to activation of said dummy word line, a capacitor including the storage electrode and a cell plate electrode, a second access transistor connected between said storage electrode and a voltage supply line, and a third access transistor electrically coupling said first bit line to the second bit line in response to activation of said dummy word line.

13. The semiconductor memory device according to claim 12, further comprising a dummy precharge line parallel to said dummy word line, and coupled in common to a gate of said second access transistor, wherein in a waiting state in which data write and read of said normal memory cell is not performed, in response to activation of said dummy precharge line, said capacitor is precharged from the voltage supply line, and in response to driving of said dummy word line to a selected state, a read voltage from each of said plurality of dummy cells to said first and second bit lines serves as the reference voltage.

14. The semiconductor memory device according to claim 11, wherein each of said plurality of dummy cells includes a first access transistor arranged in correspondence to each of said first and second bit line pairs, and electrically coupling respective first and second bit lines to a storage electrode in response to activation of said dummy word line, a capacitor having a storage electrode and a cell plate electrode common to each of said plurality of first and second bit line pairs, respectively, and a single second access transistor shared by each of said plurality of first and second bit line pairs, and electrically coupling the storage electrode to a voltage supply line in response to activation of said dummy precharge line.

* * * * *